(12) United States Patent
Xie et al.

(10) Patent No.: US 11,022,703 B2
(45) Date of Patent: Jun. 1, 2021

(54) PHOTOELECTRIC CONVERTER, DETECTOR, AND SCANNING APPARATUS

(71) Applicant: RAYCAN TECHNOLOGY CO., LTD. (SU ZHOU), Jiangsu (CN)

(72) Inventors: Qingguo Xie, Jiangsu (CN); Jun Zhu, Jiangsu (CN); Ming Niu, Jiangsu (CN); Luyao Wang, Jiangsu (CN)

(73) Assignee: RAYCAN TECHNOLOGY CO., LTD. (SU ZHOU), Jiangsu (CN)

( * ) Notice: Subject to any disclaimer, the term of this patent is extended or adjusted under 35 U.S.C. 154(b) by 0 days.

(21) Appl. No.: 15/525,266

(22) PCT Filed: Oct. 26, 2015

(86) PCT No.: PCT/CN2015/092833
§ 371 (c)(1),
(2) Date: May 8, 2017

(87) PCT Pub. No.: WO2016/074560
PCT Pub. Date: May 19, 2016

(65) Prior Publication Data
US 2018/0284294 A1 Oct. 4, 2018

(30) Foreign Application Priority Data
Nov. 14, 2014 (CN) .......................... 201410648328.4

(51) Int. Cl.
*G01T 1/164* (2006.01)
*H01L 31/107* (2006.01)
(Continued)

(52) U.S. Cl.
CPC .......... *G01T 1/1642* (2013.01); *G01T 1/2002* (2013.01); *G01T 1/248* (2013.01); *H01L 31/02327* (2013.01); *H01L 31/107* (2013.01)

(58) Field of Classification Search
None
See application file for complete search history.

(56) References Cited

U.S. PATENT DOCUMENTS 6,946,841 B2 * 9/2005 Rubashov ............ G01R 33/481
324/318
8,395,127 B1 * 3/2013 Frach .................... G01T 1/2985
250/370.11
(Continued)

FOREIGN PATENT DOCUMENTS

CN 101806912 A 8/2010
CN 102707310 A 10/2012
(Continued)

OTHER PUBLICATIONS

International Search Report dated Jan. 15, 2016 in corresponding International Application No. PCT/CN2015/092833.
(Continued)

*Primary Examiner* — Edwin C Gunberg
(74) *Attorney, Agent, or Firm* — Knobbe, Martens, Olson & Bear, LLP (57) ABSTRACT

A photoelectric converter includes a silicon photomultiplier array and a light guide coupled to the silicon photomultiplier array. The silicon photomultiplier array is generated by splicing i×j silicon photomultipliers on a horizontal plane, where both i and j are integers greater than or equal to 2. A detector includes a scintillation crystal, an electronic system, a light guide and a silicon photomultiplier. A scanning device includes a detection apparatus and a rack, the detection apparatus includes a detector, and the detector includes the photoelectric converter.

19 Claims, 5 Drawing Sheets

(51) Int. Cl.
  *G01T 1/24* (2006.01)
  *G01T 1/20* (2006.01)
  *H01L 31/0232* (2014.01)

(56) References Cited

U.S. PATENT DOCUMENTS

| | | | |
|---|---|---|---|
| 8,410,449 B2* | 4/2013 | Thon | H01J 43/18 |
| | | | 250/368 |
| 2001/0040219 A1 | 11/2001 | Cherry et al. | |
| 2005/0211906 A1* | 9/2005 | Tonami | G01T 1/202 |
| | | | 250/367 |
| 2008/0073542 A1* | 3/2008 | Siegel | G01T 1/1644 |
| | | | 250/368 |
| 2012/0307025 A1 | 12/2012 | Werner Lerche et al. | |
| 2014/0291486 A1 | 10/2014 | Nagano et al. | |
| 2015/0323684 A1 | 11/2015 | Xie et al. | |

FOREIGN PATENT DOCUMENTS

| | | |
|---|---|---|
| EP | 1617237 A1 | 1/2006 |
| JP | 2013509126 A | 3/2013 |
| JP | 2013089919 A | 5/2013 |
| WO | 2013/115975 A1 | 8/2013 |
| WO | 2013/189188 A1 | 12/2013 |

OTHER PUBLICATIONS

Bergeron, et al., Performance Evaluation of the LabPET APD-Based Digital PET Scanner, IEEE Transactions on Nuclear Science, vol. 56, No. 1, Feb. 2009, pp. 10-16.

Xie, et al., Performance Evaluation of Multi-Pixel Photon Counters for PET Imaging, 2007 IEEE Nuclear Science Symposium Conference Record, pp. 969-974.

Xie, et al., Implementation of LYSO/PSPMT Block Detector With All Digital DAQ System, IEEE Transactions on Nuclear Science, vol. 60, No. 3, Jun. 2013, pp. 1487-1494.

Supplemental European Search Report for Application No. EP15859308, dated Jun. 19, 2018 in 7 pages.

Ming Niu et al., "Evaluation of Multi-Channel Readouts using SiPM-Arrays for Small Animal PET", Nuclear Instruments & Methods in Physics Research. Section A: Accelerators, Spectrometers, Detectors, and Associated Equipment, Jan. 1, 2011, XP055480644, NL.

Japanese Office Action for Application No. 2017-525003, dated Jul. 3, 2018 in 14 pages.

* cited by examiner

PHOTOELECTRIC CONVERTER, DETECTOR, AND SCANNING APPARATUS

The present application is a National Stage application of PCT international patent application PCT/CN2015/092833, filed on Oct. 26, 2015 which claims priority to Chinese Patent Application No. 201410648328.4, titled "PHOTOELECTRIC CONVERTER, DETECTOR, AND SCANNING APPARATUS", filed on Nov. 14, 2014 with the State Intellectual Property Office of People's Republic of China, both of which are incorporated herein by reference in their entireties.

FIELD

The present disclosure relates to the technical field of nuclear medical imaging, and in particular to a photoelectric converter, a detector including the photoelectric converter and a scanning device including the detector.

BACKGROUND

A Positron Emission Tomography (hereinafter referred to as PET) detector is a key apparatus in a PET imaging device, and the PET detector is mainly used to obtain information on a position, time and energy when a γ photon deposits in a PET system. Performances of the PET detector directly determine performances of the whole PET imaging system. In order to improve an imaging performance of the system, it is expected that the used positron emission tomography detector has a high spatial resolution, a good time resolution, a good energy resolution and a high count rate and so on.

A photoelectric converter in the PET detector is used to convert a scintillation photon outputted from a front scintillation crystal into a corresponding electrical pulse and perform multiplication and amplification on the electrical pulse to obtain an electrical pulse signal which may be processed by an electronic system. In the conventional PET detector, a photoelectric conversion device is generally implemented as a photomultiplier, an avalanche photodiode and a position-sensitive photomultiplier.

In the photomultiplier, a scintillation photon is generally converted into a photoelectron by a photoelectric surface, the photoelectron is multiplied by multiple dynodes, and finally an electrical pulse signal is outputted from an anode. A gain of the photomultiplier is generally about $10^6$. The photomultiplier has advantages of a high gain, a low noise and a quick time response, therefore the photomultiplier is used in most of clinical PET photoelectric conversion devices. A volume of the photomultiplier is generally large, which may limit the spatial resolution of the PET detector and design flexibility of the PET system structure. The photomultiplier can not operate normally in a magnetic field, and thus is difficult to function as a photoelectric conversion device in a PET/MRI dual-mode imaging system.

In the avalanche photodiode, a scintillation photon is converted into a photoelectron by a photocathode, and the photoelectron is multiplied by an avalanche effect of the photodiode to obtain an electrical pulse signal. The avalanche photodiode may operate normally in the magnetic field and present certain potential in the PET/MRI dual-mode imaging system. The avalanche photodiode has a small volume and may be used to design a PET detector with a better spatial resolution. A PET for a small animal requiring a higher spatial resolution is already designed by the avalanche photodiode (Mélanie Bergeron, Jules Cadorette, Jean-François Beaudoin, Martin D. Lepage, Ghislain Robert, Vitali Selivanov, Marc-André Tétrault, Nicolas Viscogliosi, Jeffrey P. Norenberg, Réjean Fontaine, and Roger Lecomte. "Performance Evaluation of the LabPET APD-Based Digital PET Scanner," IEEE TRANSACTIONS ON NUCLEAR SCIENCE, VOL. 56, NO. 1, FEBRUARY 2009). However, the avalanche photodiode has inherent detects: a gain not high enough, approximately $10^4$, and a great noise, thereby influencing performances of the PET detector.

The position-sensitive photomultiplier has all the advantages of the photomultiplier and can achieve a high spatial resolution. The PET for a small animal requiring a higher spatial resolution is already achieved by the position-sensitive photomultiplier by a study group (Qingguo Xie, Yuanbao Chen, Jun Zhu, Jingjing Liu, Xi Wang, Xin Chen, Ming Niu, Zhongyi Wu, Daoming Xi, Luyao Wang, Peng Xiao, Chin-Tu Chen, Chien-Min Kao "Implementation of LYSO-PSPMT Block Detector with an All-Digital DAQ System," in IEEE Transactions on Nuclear Science, pp. 1487-1494, 2013), and achieves good system performances. However, a price of the position-sensitive photomultiplier is high, thereby resulting in increasing of a cost of the PET system.

In recent years, a silicon photomultiplier with a low cost draws attention of people. The silicon photomultiplier includes an avalanche photodiode micro-pixel unit array operating in a Geiger-mode, and has a gain of $10^6$ which is comparable to that of the photomultiplier. In addition, the silicon photomultiplier has a low noise, a small volume, insensitivity to a magnetic field, a good time performance, a low price when being manufactured on a large scale and adapts to be used to build the PET detector (Qingguo Xie, Robert G. Wagner, Gary Drake, Patrick DeLurgio, Yun Dong, Chin-Tu Chen, Chien-Min Kao, "Performance Evaluation of Multi-Pixel Photon Counters for PET Imaging," in Conference Record of the 2007 IEEE Nuclear Science Symposium, vol. 2, pp. 969-974, 2007). As compared with the conventional photomultiplier with a large volume, the silicon photomultiplier as the photoelectric conversion device has a small volume, a compact arrangement structure and adapts to be used to build a PET detector with a high spatial resolution, thereby improving a spatial resolution of the whole PET system finally. The silicon photomultiplier has a small volume, is convenient to be used to build multiple detector structures and adapts to be used to build a PET detector with a Depth of Interaction (referred to as DOI) detection capability, thereby greatly improving flexibility for building the PET system structure as compared with the photomultiplier with a large volume. The silicon photomultiplier has a good time performance and can be used to build a PET detector with a Time-of-Flight (referred to as TOF) capability, thereby improving a quality of a PET image. The silicon photomultiplier has a high gain and is not influenced by the magnetic field during an operation process, therefore the silicon photomultiplier is an optimal selection for a core photoelectric conversion device in a PET/MRI solution. A cost of the photomultiplier particularly the position-sensitive photomultiplier is always high, and a price of the silicon photomultiplier is low when being produced on a large scale, thereby reducing a cost of the PET system greatly.

The silicon photomultiplier has a gain comparable to that of the photomultiplier, advantages of a small volume and insensitivity to the magnetic field of the avalanche photodiode, and a good time performance. The silicon photomultiplier has advantages of both the photomultiplier and the avalanche photodiode. If the silicon photomultiplier is used as the photoelectric conversion device of the positron emission tomography detector and a good position resolution is achieved, a positron emission tomography detector with a higher spatial resolution, capabilities of DOI and TOF, applicability to PET/MRI and a low cost can be designed and built based on the silicon photomultiplier.

Therefore, it needs to provide a new photoelectric converter including the silicon photomultiplier, to overcome defects of the detector in the conventional technology.

SUMMARY

In view of above, an object of the present disclosure is to provide a photoelectric converter with a higher spatial resolution, a detector including the photoelectric converter and a scanning device including the detector.

An object of the present disclosure is to provide a photoelectric converter with a higher spatial resolution. The photoelectric converter includes a silicon photomultiplier array, the silicon photomultiplier array is generated by splicing i×j silicon photomultipliers on a horizontal plane, and where i indicates the number of the silicon photomultipliers in a length direction on the horizontal plane, j indicates the number of the silicon photomultipliers in a width direction on the horizontal plane, and both i and j are integers greater than or equal to 2.

Another object of the present disclosure is to provide a detector including the photoelectric converter. The detector includes a scintillation crystal, an electronic system, and the photoelectric converter, and where the scintillation crystal, a light guide and the silicon photomultiplier array are coupled by an optical coupling agent in the order listed.

Another object of the present disclosure is to provide a scanning device including the detector. The scanning device includes a detection apparatus and a rack, the detection apparatus is mounted on the rack, and the detection apparatus includes the detector.

It can be seen from the above technical solutions that, a photoelectric detection solution using the silicon photomultiplier is adopted in the present disclosure. The silicon photomultiplier has a small volume and a compact arrangement structure, an appropriate number of silicon photomultipliers having appropriate sizes are cooperated with a light guide having an appropriate shape, such that photons of the scintillation crystal diffuse in the light guide, and a PET detector with a high spatial resolution can be built using rich spatial information, thereby improving a spatial resolution of the whole PET system finally. In addition, the silicon photomultiplier adapts to be used to build a PET detector with capabilities of DOI and TOF and has applicability to PET/MRI and a low cost.

As compared with the conventional technology, the present disclosure has the following beneficial effects.

1. As compared with a conventional solution using the photomultiplier with a large volume, with the photoelectric detection system solution using the silicon photomultiplier, the silicon photomultiplier has a small volume and a compact arrangement structure, an appropriate number of silicon photomultipliers having appropriate sizes are cooperated with a light guide having an appropriate shape, such that a PET detector with a high inherent spatial resolution can be built, thereby improving a spatial resolution of the whole PET system finally.

2. The silicon photomultiplier has a gain ($10^6$) comparable to that of the photomultiplier and an acceptable noise. The conventional photoelectric conversion device, an avalanche photodiode, has only a gain of $10^4$ and a great noise, thereby resulting in a low performance of a PET detector including the avalanche photodiode.

3. The silicon photomultiplier has a small volume, is convenient to be used to build multiple detector structures and adapts to be used to build a PET detector with a DOI detection capability, thereby greatly improving flexibility for building the PET detector structure as compared with the photomultiplier with a large volume.

4. The silicon photomultiplier has a good time performance and can be used to build a PET detector with a TOF capability, thereby improving a quality of a PET image.

5. The photomultiplier generally used in the conventional PET detector can not operate normally in a magnetic field, and thus it is difficult to select a photoelectric conversion device when researching and developing a PET/MRI dual-mode imaging system. The silicon photomultiplier has a high gain and is not influenced by the magnetic field during an operation process, and thus the silicon photomultiplier is an optimal selection for a core photoelectric conversion device in the PET/MRI solution.

6. Due to a complicated producing process, the photomultiplier particularly the position-sensitive photomultiplier always has a high cost. The silicon photomultiplier has a low price when being produced on a large scale, thereby reducing a cost for building the PET system greatly.

7. With three types of electronic pre-processing circuits, not only the number of channels of the PET detector built based on the silicon photomultiplier can be effectively reduced, but also information on a position, energy and time for γ photon deposition is not lost, such that the PET detector built based on the silicon photomultiplier is easier to be implemented in engineering.

DETAILED DESCRIPTION OF EMBODIMENTS

A silicon photomultiplier has a gain comparable to that of a photomultiplier, advantages of a small volume and insensitivity to a magnetic field of an avalanche photodiode, a good time performance and a low price when being produced on a large scale. The silicon photomultiplier has advantages of both the photomultiplier and the avalanche photodiode. The advantages are utilized sufficiently and a corresponding light guide design is provided, such that photons of a scintillation crystal diffuse in the light guide. With the rich spatial distribution information in combination with a back electronic design and a position read algorithm, information on a deposition position of the γ photons can be obtained accurately, and thus a spatial resolution of the PET detector breaks a size limitation of the silicon photomultiplier.

Based on the above analysis, it is provided according to the disclosure a photoelectric converter with a higher spatial resolution, capabilities of DOI and TOF, a low cost and applicability to PET/MRI, a detector including the photoelectric converter and a scanning device including the detector.

The scanning device includes a detection apparatus and a rack, where the detection apparatus is mounted on the rack and the detection apparatus includes a detector.

The detector includes a scintillation crystal, an electronic system and a photoelectric converter. The photoelectric converter includes a silicon photomultiplier array and a light guide coupled to the silicon photomultiplier array. The scintillation crystal, the light guide and the silicon photomultiplier array are coupled by an optical coupling agent in the order listed. The silicon photomultiplier has a small volume, is convenient to be used to build multiple detector structures and adapts to be used to build a PET detector with a DOI detection capability, thereby greatly improving flexibility for building the PET detector structure as compared with a photomultiplier with a large volume. The silicon photomultiplier has a good time performance, and can be used to build a PET detector with a TOF capability, thereby improving a quality of a PET image.

The silicon photomultiplier array is generated by splicing i×j silicon photomultipliers on a horizontal plane, where both i and j are integers greater than or equal to 2. The scintillation crystal, the light guide and the silicon photomultiplier array are coupled by an optical coupling agent in the order listed. Scintillation photons from a scintillation crystal diffuse when passing through a light guide, and deposition positions of γ photons in the scintillation crystal can be obtained accurately based on a distribution of the photons received by silicon photomultipliers coupled to the light guide in combination with a position algorithm. As compared with a conventional solution using a photomultiplier with a large volume, with the photoelectric detection system solution using the silicon photomultiplier, the silicon photomultiplier has a small volume, a low price and a compact arrangement structure, in a case that the silicon photomultiplier is used to build a PET detector, a spatial resolution of the detector may be improved and an imaging quality of the system may be finally improved. In addition, the silicon photomultiplier has a gain ($10^6$) comparable to that of the photomultiplier and an acceptable noise. The conventional photoelectric conversion device, the avalanche photodiode, has only a gain of $10^4$ and a great noise, thereby resulting in a low performance of a PET detector including the avalanche photodiode.

Figure 1:
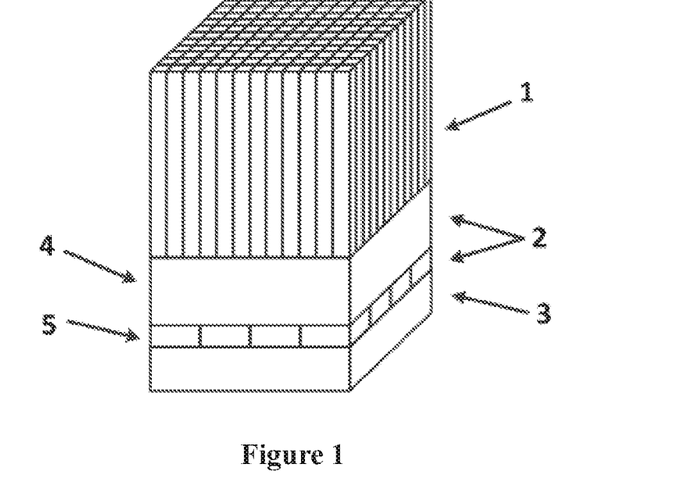
FIG. 1 is a schematic stereogram of a photoelectric converter according to a first embodiment of the present disclosure.

As shown in FIG. 1, the detector includes: a scintillation crystal 1 configured to convert a γ photon into a scintillation photon, a photoelectric converter 2 configured to convert the scintillation photon into an electrical pulse signal, and an electronic system 3 configured to calculate a position, energy and a time signal for γ photon deposition based on the electrical pulse signal. The photoelectric converter 2 includes a light guide 4 and a silicon photomultiplier array 5 coupled to the light guide 4, and the scintillation crystal 1, the light guide 4 and the silicon photomultiplier array 5 are coupled by an optical coupling agent in the order listed. The optical coupling agent may be an optical glue.

The light guide is an optical fiber, a full-cut transparent element, a non-full-cut transparent element or a continuous transparent element. The transparent element is made of common inorganic glass, organic glass or a scintillation crystal.

The scintillation crystal includes: an array crystal including a single crystal strip, a non-full-cut array crystal, a non-cut continuous crystal or a multilayer crystal including a continuous crystal and an array crystal.

The scintillation crystal is an inorganic scintillation crystal and is made of bismuth germinate, lutetium silicate, lanthanum bromide, lutetium yttrium silicate, yttrium silicate, barium fluoride, sodium iodide and cesium iodide.

In the conventional technology, silicon photomultipliers manufactured by different manufactures have different names, including a silicon photomultiplier (SiPM), a multi-pixel photo counter (MPPC), a Geiger-mode avalanche photodiode (G-APD) and a digital silicon photomultiplier (dSiPM). Although the names are different, but actually all of them refer to the silicon photomultiplier according to the present disclosure and have a same principle and function. In the present disclosure, it is referred to as the silicon photomultiplier collectively, and the protection scope of the present disclosure is not changed for different names. That is, others can not consider that their products belong to an invention concept different from the present disclosure due to different names. The actual protection scope of the silicon photomultiplier disclosed in the present disclosure includes products related to the silicon photomultiplier and named differently by different manufactures in the conventional technology.

A detection area of the single silicon photomultiplier ranges from $1 \times 1$ mm$^2$ to $6 \times 6$ mmm$^2$, and an area of a micro pixel unit ranges from $25 \times 25$ μm$^2$ to $100 \times 100$ μm$^2$.

Figure 2:
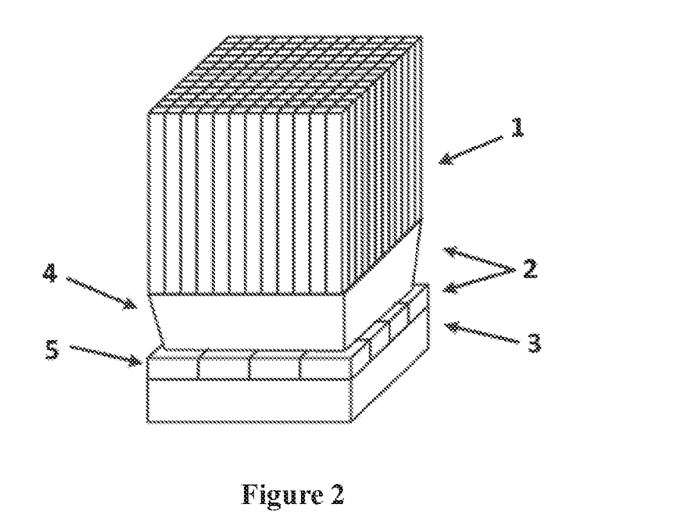
FIG. 2 is a schematic stereogram of a photoelectric converter according to a second embodiment of the present disclosure.

A shape of the light guide may be a cone, a cylinder, a cuboid, a cube and a cone-like polyhedron, and practically the light guide may have other shapes, which are not listed in detail here. The light guide includes an optical fiber, a full-cut transparent element, a non-full-cut transparent element, a continuous transparent element or other transparent elements, and the transparent element is made of common inorganic glass, organic glass and a scintillation crystal. The light guide includes P layers, where P ranges from 0 to 4. A total thickness of the layers of the light guide ranges from 0.1 mm to 50 mm. FIG. 1 and FIG. 2 only show a case that the number of layers of the light guide, m, is one and the light guide is a continuous transparent element.

The photoelectric converter includes a silicon photomultiplier array generated by splicing i×j silicon photomultipliers on a horizontal plane, where i indicates the number of the silicon photomultipliers in a length direction on the horizontal plane, i is an integer greater than or equal to 2, j indicates the number of the silicon photomultipliers in a width direction on the horizontal plane, and j is an integer greater than or equal to 2. In response to one γ photon deposition event, the photoelectric converter generates k paths of electrical pulse signals, where k is an integer greater than or equal to 4. The electronic system processes the k paths of electrical pulse signals to obtain information on energy, a position and time of the γ photon. The electronic system, configured to process the electrical signals to obtain the information on the position, the energy and the time of the γ photon, does not pre-process the k paths of electrical pulse signals, directly reads the k paths of electrical pulse signals one by one, and calculates a deposition position of the γ photon using a maximum likelihood estimation method and an artificial neural network positioning algorithm.

Figure 4:
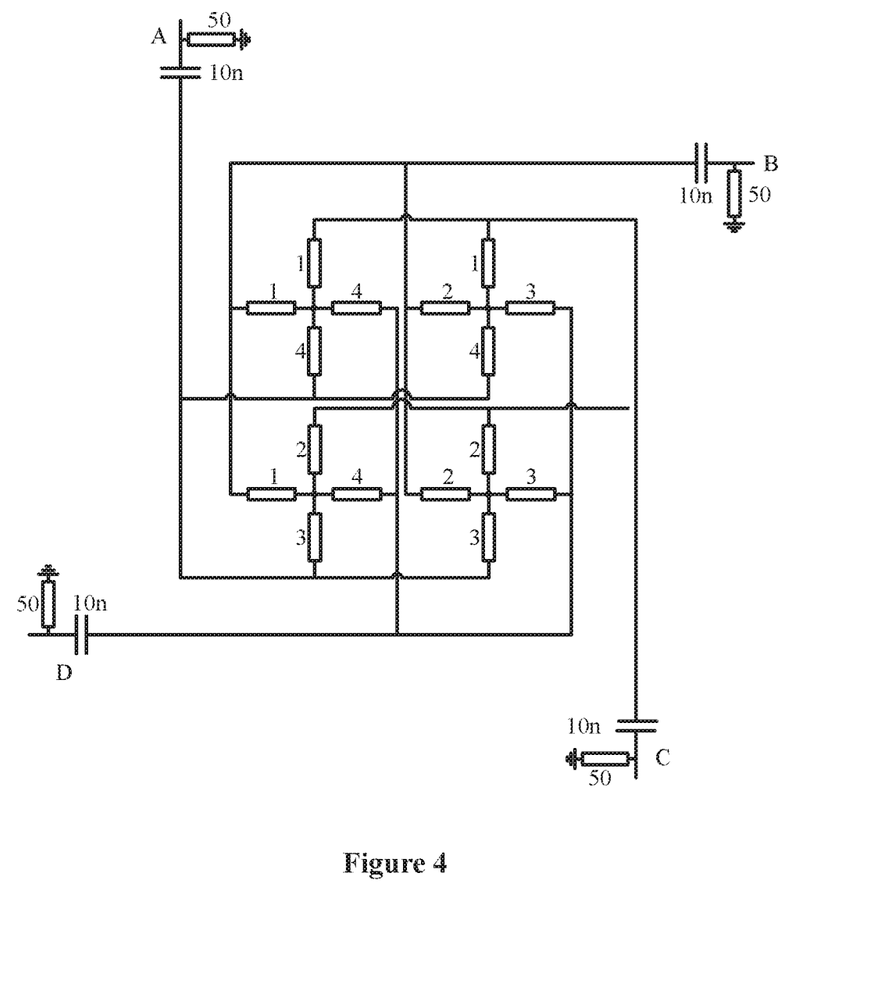
FIG. 4 is a schematic diagram showing how four paths of weighted signals are finally generated from four channels of silicon photomultiplier signals by a resistor network according to the present disclosure.
Figure 5:
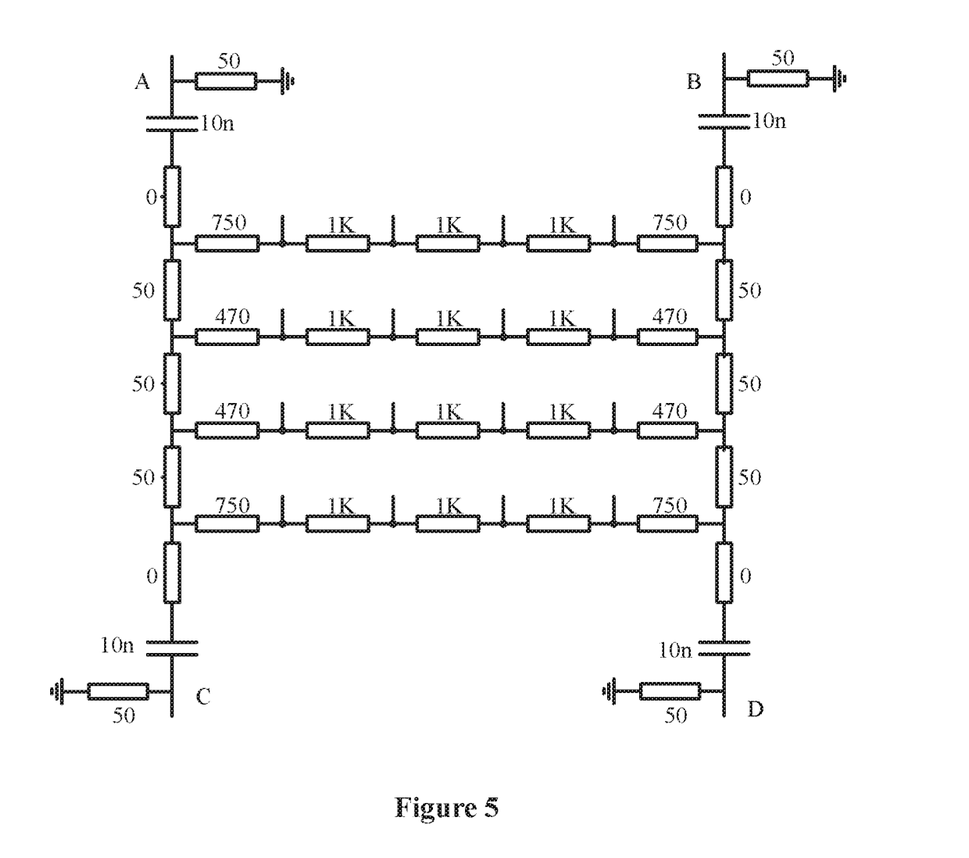
FIG. 5 is a schematic diagram showing how four paths of weighted signals are finally generated from sixteen channels of silicon photomultiplier signals by a simpler resistor network according to the present disclosure.
Figure 6:
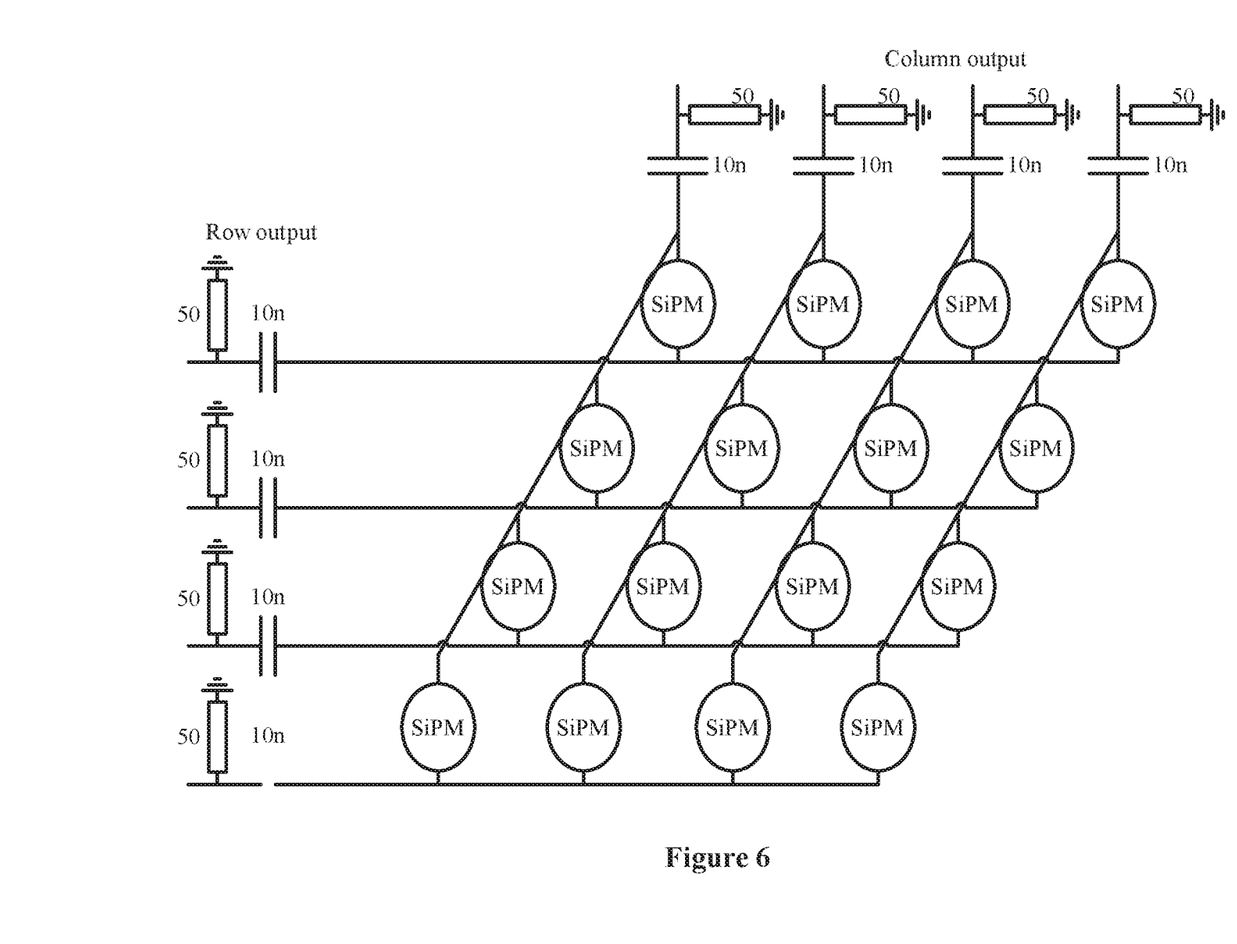
FIG. 6 is a schematic diagram showing how eight paths of weighted signals are finally generated from sixteen channels of silicon photomultiplier signals by acquiring cathode signals and an anode signals of the silicon photomultipliers simultaneously.

The electronic system, configured to process the electrical signals to obtain the information on the position, the energy and the time of the γ photon, may pre-process the k paths of electrical pulse signals to reduce the number of electronic channels. Pre-processing circuits include: an Anger circuit, a discretized proportional counter (DPC) circuit, and a cross-wire circuit. The k paths of electrical pulse signals are pre-processed to obtain m paths of electrical pulse signals, where m is an integer which is greater than or equal to 4 and is less than or equal to k. FIGS. 4 to 6 respectively show the Anger circuit, the DPC circuit and the cross-wire circuit. With the three types of electronic pre-processing circuits described above, not only the number of channels of a PET detector built based on the silicon photomultipliers can be effectively reduced, but also the information on the position, the energy and the time for γ photon deposition is not lost, such that the PET detector built based on the silicon photomultipliers is easier to be implemented in engineering.

The electronic system calculates the deposition position of the γ photon based on the m electrical pulse signals by using a position algorithm. The position algorithm includes: a centroid method, an Anger-Logic method, a maximum likelihood estimation method and an artificial neural network positioning algorithm.

The electronic system may calculate deposition time of the γ photon based on the m electrical pulse signals by using a time algorithm. The time algorithm refers to an algorithm in which a sum or a weighted sum of the m electrical pulse signals is calculated to obtain a sum electrical pulse signal and time information of the sum electrical pulse signal is extracted as the deposition time of the γ photon.

The algorithm for calculating the time includes: a constant fraction discrimination (CFD) method, a leading edge discrimination (LED) method, a multi-voltage threshold (MVT) method and a regular-time sampling (RTS) method.

Hereinafter technical solutions in embodiments of the present disclosure are described in detail in conjunction with the drawings in the embodiments of the present disclosure. Apparently, the described embodiments are only a part rather than all of the embodiments of the disclosure. Any other embodiments obtained based on the embodiments in the present disclosure by those skilled in the art without any creative work fall within the protection scope of the present disclosure.

First Embodiment

As shown in FIG. 1, a detector includes a scintillation crystal 1, a photoelectric converter 2 and an electronic system 3. The scintillation crystal 1 is generated by splicing 12×12 scintillation crystal strips with a same size on a horizontal plane. A bottom surface of the scintillation crystal 1 is directly coupled to a top surface of a light guide 4. A silicon photomultiplier array 5 includes 4×4 silicon photomultipliers with a same size. The light guide includes only one layer, has a shape of a cuboid and a thickness of 13 mm, and is made of glass. In the electronic system 3, firstly a DPC circuit is adopted to reduce the number of channels from 16 to 4, and then an Anger-Logic algorithm is adopted to obtain a deposition position of the γ photon. A method for acquiring information on deposition time of the γ photon includes: calculating a sum of the four paths of signals outputted from the DPC circuit and extracting time of the sum signal as deposition time of the γ photon.

Second Embodiment

As shown in FIG. 2, a detector includes a scintillation crystal 1, a photoelectric converter 2 and an electronic system 3. The scintillation crystal 1 is generated by splicing 12×12 scintillation crystal strips with a same size on a horizontal plane. A bottom surface of the scintillation crystal 1 is directly coupled to a top surface of a light guide 4. A silicon photomultiplier array 5 includes 4×4 silicon photomultipliers with a same size. The light guide includes only one layer, has a shape of a cone-like hexahedron, an upper surface and a lower surface of a square, four lateral surfaces of a trapezoid and a thickness of 13 mm, where areas of the upper surface and the lower surface are different. In the electronic system 3, firstly a cross-wire circuit is adopted to reduce the number of channels from 16 to 8, and then a maximum likelihood estimation method is adopted to obtain a deposition position of the γ photon. A method for acquiring information on deposition time of the γ photon includes: calculating a sum of the four paths of signals outputted from the cross-wire circuit in one direction and extracting time of the sum signal as deposition time of the γ photon.

Third Embodiment

Figure 3:
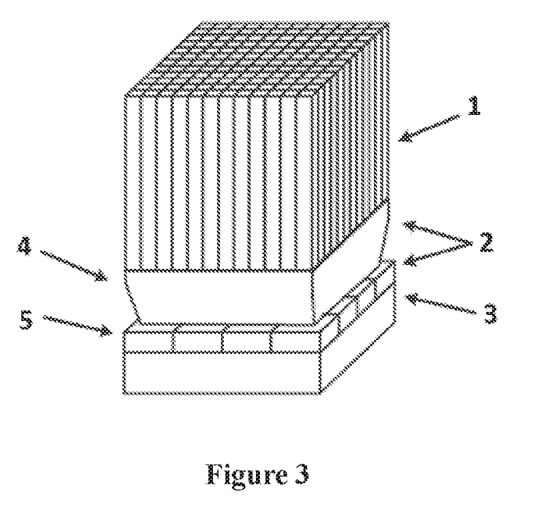
FIG. 3 is a schematic stereogram of a photoelectric converter according to a third embodiment of the present disclosure.

As shown in FIG. 3, a position-sensitive PET detector based on a silicon photomultiplier includes: a scintillation crystal 1, a photoelectric converter 2 and an electronic system 3. The scintillation crystal 1 is generated by splicing 12×12 scintillation crystal strips with a same size on a horizontal plane. A bottom surface of the scintillation crystal 1 is directly coupled to a top surface of a light guide 4. A silicon photomultiplier array 5 includes 4×4 silicon photomultipliers with a same size. The light guide includes only one layer, has a shape of a cone-like decahedron, i.e., a cuboid plus a hexahedron (it is a continuous light guide between the cuboid and the hexahedron), an upper surface and a lower surface of a square, eight lateral surfaces including four lateral surfaces of a rectangle and four lateral surfaces of a trapezoid, and a thickness of 13 mm, where areas of the upper surface and the lower surface are different. In the electronic system 3, firstly a cross-wire circuit is adopted to reduce the number of channels from 16 to 8, and then a maximum likelihood estimation method is adopted to obtain a deposition position of a γ photon. A method for acquiring information on deposition time of the γ photon includes: calculating a sum of four paths of signals outputted from the cross-wire circuit in one direction and extracting time of the sum signal as deposition time of the γ photon.

FIG. 4 shows a schematic diagram of an Anger circuit. In FIG. 4, it is illustrated how four paths of weighted signals are finally generated from four channels of silicon photomultiplier signals by a resistor network. Specifically, each channel of signal is weighted by different resistance ratios in each direction, and then a position for generating a silicon photomultiplier signal is calculated using a centroid method. The principle shown in FIG. 4 may be applied to a case how four paths of weighted signal are finally generated from sixteen or sixty-four channels of signals without any creative work.

FIG. 5 shows a schematic diagram of a DPC circuit. In FIG. 5, it is illustrated how four paths of weighted signals are finally generated from sixteen channels of silicon photomultiplier signals by a simpler resistor network. Apparently, in the circuit, different weighted values are applied to silicon photomultiplier signals at different positions in each path, and positions are generated using the Anger-Logic algorithm. Apparently, the resistances in the circuit are only schematic. The principle shown in FIG. 5 may be applied to a case how four paths of weighted signals are finally generated from x×y paths of silicon photomultiplier channel signals by only changing a part of the resistances or the number of the resistors without any creative work, where both x and y are integers greater than or equal to 2.

FIG. 6 shows a schematic diagram of a cross-wire circuit. In FIG. 6, it is illustrated how eight paths of weighted signals are finally generated from sixteen channels of silicon photomultiplier signals by acquiring cathode signals and anode signals of the silicon photomultipliers simultaneously. Apparently, with the circuit, x×y paths of silicon photomultiplier signals can be reduced into x×y paths of signals, where both x and y are integers greater than or equal to 2. Then positions are generated using a maximum likelihood estimation method or an artificial neural network algorithm. Apparently, the principle shown in FIG. 6 may be applied to a case of other x×y paths of silicon photomultipliers without any creative work, where both x and y are integers greater than or equal to 2.

As compared with the conventional technology, the present disclosure has the following beneficial effects.

1. As compared with a conventional solution using the photomultiplier with a large volume, with the photoelectric detection system solution using the silicon photomultiplier, the silicon photomultiplier has a small volume and a compact arrangement structure, an appropriate number of silicon photomultipliers having appropriate sizes are cooperated with a light guide having an appropriate shape, such that a PET detector with a high inherent spatial resolution can be built, thereby improving a spatial resolution of the whole PET system finally.

2. The silicon photomultiplier has a gain ($10^6$) comparable to that of the photomultiplier and an acceptable noise. The conventional photoelectric conversion device, an avalanche photodiode, has only a gain of $10^4$ and a great noise, thereby resulting in a low performance of a PET detector including the avalanche photodiode.

3. The silicon photomultiplier has a small volume, is convenient to be used to build multiple detector structures and adapts to be used to build a PET detector with a DOI detection capability, thereby greatly improving flexibility for building the PET detector structure as compared with the photomultiplier with a large volume.

4. The silicon photomultiplier has a good time performance and can be used to build a PET detector with a TOF capability, thereby improving a quality of a PET image.

5. The photomultiplier generally used in the conventional PET detector can not operate normally in a magnetic field, and thus it is difficult to select a photoelectric conversion device when researching and developing a PET/MRI dual-mode imaging system. The silicon photomultiplier has a high gain and is not influenced by the magnetic field during an operation process, and thus the silicon photomultiplier is an optimal selection for a core photoelectric conversion device in the PET/MRI solution.

6. Due to a complicated producing process, the photomultiplier always has a high cost. The silicon photomultiplier has a low price when being produced on a large scale, thereby reducing a cost for building the PET system greatly.

7. With three types of electronic pre-processing circuits, not only the number of channels of the PET detector built based on the silicon photomultiplier can be effectively reduced, but also information on a position, energy and time for γ photon deposition is not lost, such that the PET detector built based on the silicon photomultiplier is easier to be implemented in engineering.

What is claimed is:

1. A detector, comprising:
    a scintillation crystal array, comprising a plurality of scintillation crystals on a horizontal plane;
    an electronic system; and
    a photoelectric converter, wherein the photoelectric converter comprises a silicon photomultiplier array generated by directly splicing i rows and j columns of silicon photomultipliers on a horizontal plane, wherein each silicon photomultiplier includes an avalanche photodiode micro-pixel unit array consisting of a plurality of micro pixel units; and wherein i indicates the number of the silicon photomultipliers in a length direction on the horizontal plane, j indicates the number of the silicon photomultipliers in a width direction on the horizontal plane, both i and j are integers greater than or equal to 2, a detection area of a single silicon photomultiplier ranges from $1\times1$ $mm^2$ to $6\times6$ $mm^2$ and an area of each micro pixel unit of the silicon photomultiplier ranges from $25\times25$ $\mu m^2$ to $100\times100$ $\mu m^2$, wherein the photoelectric converter further comprises a light guide coupled to the silicon photomultiplier array, wherein the light guide comprises P layers, wherein the light guide is made of a non-full-cut or continuous optical fiber, a non-full-cut or continuous common inorganic glass or a non-full-cut or continuous organic glass, wherein P ranges from 2 to 4, and wherein a total thickness of the layers of the light guide ranges from 0.1 mm to 50 mm, wherein
    the scintillation crystal array, a light guide and the silicon photomultiplier array are coupled by an optical coupling agent in the order listed; wherein
    the photoelectric converter is configured to generate k paths of electrical pulse signals in response to one γ photon deposition event, wherein k corresponds to the number of the silicon photomultipliers; wherein
    the electronic system is configured to pre-process the k paths of electrical pulse signals to reduce the number of electronic channels, to obtain m paths of electrical pulse signals, and to calculate a deposition position of the γ photon based on the reduced m electrical pulse signals by using a position algorithm, wherein m is an integer which is less than k; and wherein
    the scintillation crystals and the silicon photomultipliers are sized such that each silicon photomultiplier corresponds to multiple scintillation crystals.

2. The detector according to claim 1, wherein a shape of the light guide is a cone, a cylinder, a cuboid, a cube or a cone-like polyhedron.

3. The detector according to claim 1, wherein the electronic system processes the k paths of electrical pulse signals to obtain information on energy and time of a γ photon.

4. The detector according to claim 1, wherein the electronic system calculates deposition time of the γ photon based on the m electrical pulse signals by using a time algorithm, and the time algorithm comprises: calculating a sum or a weighted sum of the m electrical pulse signals to obtain a sum electrical pulse signal, and extracting time information of the sum electrical pulse signal as the deposition time of the γ photon.

5. The detector according to claim 1, wherein the scintillation crystals and the silicon photomultipliers are sized such that each silicon photomultiplier corresponds to nine scintillation crystals.

6. The detector according to claim 1, wherein the scintillation crystals and the silicon photomultipliers are sized such that each silicon photomultiplier corresponds to a 3×3 subarray of the nine scintillation crystals.

7. The detector according to claim 1, wherein the electronic system is configured to pre-process the k paths of electrical pulse signals to reduce the number of electronic channels, to obtain i paths of electrical pulse signals corresponding to i rows of the silicon photomultipliers or j paths of electrical pulse signals corresponding to the j columns of the silicon photomultipliers.

8. The detector according to claim 7, wherein the electronic system is configured to obtain the i paths of electrical pulse signals or the j paths of electrical pulse signals by applying different resistance weights to different paths of electrical pulse signals in a resistor network.

9. The detector according to claim 7, wherein the electronic system is configured to obtain the i paths of electrical pulse signals or the j paths of electrical pulse signals by applying different resistance weights to different paths of electrical pulse signals in a resistor network.

10. The detector according to claim 1, wherein the electronic system is configured to pre-process the k paths of electrical pulse signals to reduce the number of electronic channels, to obtain i+j paths of electrical pulse signals corresponding to the i rows of the silicon photomultipliers and the j columns of the silicon photomultipliers.

11. The detector according to claim 10, wherein the electronic system is configured to obtain the paths of electrical pulse signals by acquiring cathode signals and anode signals of the silicon photomultipliers simultaneously.

12. The detector according to claim 10, wherein the electronic system is configured to obtain the i+j paths of electrical pulse signals by acquiring cathode signals and anode signals of the silicon photomultipliers simultaneously.

13. The detector according to claim 1, wherein the electronic system is configured to pre-process the k paths of electrical pulse signals to reduce the number of electronic channels, to obtain i+j paths of electrical pulse signals corresponding to the i rows of the silicon photomultipliers and the j columns of the silicon photomultipliers.

14. A scanning device, comprising:
a rack; and
a detection apparatus mounted on the rack, wherein the detection apparatus comprises a detector, and the detector comprises a photoelectric converter and an electronic system, wherein the photoelectric converter comprises a silicon photomultiplier array generated by directly splicing i rows and j columns of silicon photomultipliers on a horizontal plane, wherein each silicon photomultiplier includes an avalanche photodiode micro-pixel unit array consisting of a plurality of micro pixel units; and wherein i indicates the number of the silicon photomultipliers in a length direction on the horizontal plane, j indicates the number of the silicon photomultipliers in a width direction on the horizontal plane, both i and j are integers greater than or equal to 2, a detection area of a single silicon photomultiplier ranges from 1×1 mm$^2$ to 6×6 mm$^2$ and an area of each micro pixel unit of the silicon photomultiplier ranges from 25×25 μm$^2$ to 100×100 μm$^2$, wherein the photoelectric converter further comprises a light guide coupled to the silicon photomultiplier array, wherein the light guide comprises P layers, wherein the light guide is made of a non-full-cut or continuous optical fiber, a non-full-cut or continuous common inorganic glass or a non-full-cut or continuous organic glass, wherein P ranges from 2 to 4, and wherein a total thickness of the layers of the light guide ranges from 0.1 mm to 50 mm;

the photoelectric converter is configured to generate k paths of electrical pulse signals in response to one γ photon deposition event, wherein k corresponds to the number of the silicon photomultipliers; wherein the electronic system is configured to pre-process the k paths of electrical pulse signals to reduce the number of electronic channels, to obtain m paths of electrical pulse signals, and to calculate a deposition position of the γ photon based on the reduced m electrical pulse signals by using a position algorithm, wherein m is an integer which is less than k.

15. The scanning device according to claim 14, wherein a shape of the light guide is a cone, a cylinder, a cuboid, a cube or a cone-like polyhedron.

16. The scanning device according to claim 14, wherein the detector, further comprises a scintillation crystal array, comprising a plurality of scintillation crystals on a horizontal plane: wherein the scintillation crystals and the silicon photomultipliers are sized such that each silicon photomultiplier corresponds to multiple scintillation crystals.

17. The scanning device according to claim 16, wherein the scintillation crystals and the silicon photomultipliers are sized such that each silicon photomultiplier corresponds to nine scintillation crystals.

18. The scanning device according to claim 17, wherein the scintillation crystals and the silicon photomultipliers are sized such that each silicon photomultiplier corresponds to a 3×3 subarray of the nine scintillation crystals.

19. The scanning device according to claim 14, wherein the electronic system is configured to pre-process the k paths of electrical pulse signals to reduce the number of electronic channels, to obtain i paths of electrical pulse signals corresponding to i rows of the silicon photomultipliers or j paths of electrical pulse signals corresponding to the j columns of the silicon photomultipliers.

* * * * *

UNITED STATES PATENT AND TRADEMARK OFFICE
CERTIFICATE OF CORRECTION

PATENT NO. : 11,022,703 B2  
APPLICATION NO. : 15/525266  
DATED : June 1, 2021  
INVENTOR(S) : Qingguo Xie et al.

Page 1 of 1

It is certified that error appears in the above-identified patent and that said Letters Patent is hereby corrected as shown below:

On the Title Page

In Column 2, item (74), Attorney, Agent, or Firm, Line 1, delete "Martens," and insert -- Martens --.

In the Specification

In Column 2, Line 3, delete "Lecomte." and insert -- Lecomte, --.

In Column 6, Line 36, delete "mmm$^2$," and insert -- mm$^2$, --.

In Column 9, Line 17, delete "xxy" and insert -- x+y --.

In the Claims

In Column 11, Line 33, Claim 11, delete "the" and insert -- the i+j --.

In Column 12, Line 37, Claim 16, delete "plane:" and insert -- plane; --.

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*